United States Patent [19]

Lopez et al.

[11] Patent Number: 5,530,349
[45] Date of Patent: Jun. 25, 1996

[54] MAGNETIC FIELD SENSOR DEVICE USING A FLUX-GATE PRINCIPLE

[75] Inventors: Braulio T. Lopez; Miguel H. Carbonero; Francisco S. Hernandez; Claudio A. Hernandez-Ros; Carmen S. Trujillo; Eloisa L. Perez; Pedro S. Sanchez, all of Madrid, Spain

[73] Assignee: Alcatel Standard Electrica, S.A., Madrid, Spain

[21] Appl. No.: 176,701

[22] Filed: Jan. 3, 1994

[30] Foreign Application Priority Data

Dec. 31, 1992 [ES] Spain ..................................... 9202675

[51] Int. Cl.⁶ ................................................ G01R 33/04
[52] U.S. Cl. ........................................................ 324/254
[58] Field of Search .................................. 324/253, 254, 324/255; 33/361

[56] References Cited

U.S. PATENT DOCUMENTS 3,286,169  11/1966  Slonczewski ........................... 324/254

FOREIGN PATENT DOCUMENTS 0059770   9/1982   European Pat. Off. .
0087890   9/1983   European Pat. Off. .
0120691  10/1984   European Pat. Off. .
2025605   9/1970   France .
57-199969 12/1982  Japan .

OTHER PUBLICATIONS

Proceedings of Eurosensors VI Sensors and Actuators A, vol. 37–38, Jun. 1993, Lausanne Ch, pp. 442–448, B. Tamayo et al "Magnetometric Sensor to Control the Ground Traffic of Aircraft".

The "Flux–gate magnetometer" by F. Primdahl, published in the J. Phys. E: Sci. Instrum., vol. 12, 1979, p. 241 et seq.;.

Databook vol. 1, 1989, National Semiconductor, "Data Acquisition Linear Devices," pp. 1–152 to 1–173, dev.: MF8, 4th–Order Switched Capacitor Bandpass Filter;.

Primary Examiner—Walter E. Snow
Attorney, Agent, or Firm—Frishauf, Holtz, Goodman, Langer & Chick

[57] ABSTRACT

The sensor device uses the flux-gate principle and detects and cancels a second harmonic frequency ($2f_o$) output by a sensor coil (23). The sensor device includes a master oscillator (1) that provides a stable output that is supplied to a generator (2) which generate two signals which respectively have a basic operating frequency ($f_o$) and a double basic operating frequency ($2f_o$ or $2fc$). The basic operating frequency ($f_o$) is amplified in a power booster (3) and is connected to drive coil (22) mounted on a core (39) in the sensor head (4) to saturate the core (39). The output signal from the sensor coil (23) of sensor head (4) is filtered in a first bandpass filter (5) to obtain the second harmonic of the sensor coil, the output signal of the first bandpass filter (5) is detected in a phase detector (6) that is also connected to receive the double ($2fc$) frequency. The phase detector output is connected to a second low filter (7). A communications circuit (8) and a self-calibration circuit (9) for the transmission and reception of data to and from a remote station (27), enables a self-calibrating and checking of operation of the sensor device based on control command signals received from the remote station (27). The filters (46, 47) are preferably switched-type capacitor filters; they are controlled, as is also the phase detector (6) by the master oscillator.

23 Claims, 4 Drawing Sheets

MAGNETIC FIELD SENSOR DEVICE USING A FLUX-GATE PRINCIPLE

BACKGROUND OF THE INVENTION

Reference to related application, assigned to the Assignee of the present invention.

U.S. Ser. No. 08/176,712 filed Jan. 3, 1994, C. AROCR HERNANDEZ-ROS et al. claiming priority of Spanish application P 9202688, Attorney Docket 930838/WJB.

Reference to related publications:

The "Flux-gate magnetometer" by F. Primdahl, the entire contents of which is incorporated herein by reference, published in the J. Phys. E: Sci. Instrum., vol. 12, 1979, pages 241 et. seq. "Switch capacitor circuits" by Philip E. Allen & Edgar Sanchez-Sinenchio, Van Nostrand Reinhold Company Inc., 135 West 50th Street, N.Y. 10020 USA.

Databook Volume 1, 1989, National Semiconductor, "Data Acquisition Linear Devices, pages 1–152 to 1–173, dev.: MF8, 4th-Order Switched Capacitor Bandpass Filter; and Databook Volume 2, Texas Instruments, "Linear Circuits" Data Acquisition and Conversion, pages 2–139 to 2–153, dev.: TLC10/MF10A, TLC20/MF10C, Universal Dual Switched-Capacitor Filter.

FIELD OF THE INVENTION

This invention relates to a high sensitivity magnetic field sensor device, which utilizes a flux-gate principle, for measuring magnetic fields over a wide dynamic range and within a broad range of temperatures.

BACKGROUND

The operating principle of a flux-gate sensor has been well known for many years. A core of ferromagnetic material has a magnetizing coil wound thereon in order to magnetically saturate the core. A sensor pickup coil detects the changes in magnetic permeability of the core resulting from asymmetry in the hysteresis characteristic of the core when there is another magnetic field produced externally to said core.

The sensor has a core that is made of a ferromagnetic material. Wound on the core is: (1) a drive coil for magnetically saturating the core, and (2) a sensor or pickup coil that detects the changes in magnetic permeability of the core.

In an article entitled, "The Fluxgate Magnetometer" by F. Primdahl, the entire contents of which is incorporated herein by reference, published in the J. Phys. E: Sci. Instrum., vol. 12, 1979, FIG. 11 therein shows a block diagram of an electronic circuit for measuring magnetic fields based on the flux-gate principle, which is also explained in detail in section 10 of said article appearing on page 246. The basic flux-gate principle is outlined on page 241 of said Primdahl article.

In FIG. 11 of this article by F. Primdahl, two signals are obtained which have angular frequencies of w and 2w respectively. The two signals are obtained by dividing a clock signal from a master oscillator. The first signal, having the frequency w, is amplified and applied to the magnetizing, i.e., drive coil of the sensor head, which creates a magnetic field that saturates the core. The signal that is coupled into the sensor coil is filtered at an angular frequency of 2w by means of a 2w bandpass filter, the amplitude of the signal 2w is detected by a phase detector which takes into account a coherence of the 2w signal from the master oscillator 2w frequency signal supplied thereto from the sensor coil.

A field compensating coil is also provided on the core. The output signal of the phase detector is then filtered and amplified before being fed back to the compensating coil of the sensor head which has the effect of cancelling a second harmonic signal detected by the sensor coil of the sensor head. As a result of the foregoing, the output voltage of the phase detector is proportional to the cancelled magnetic field that corresponds to a magnetic field created inside the core by an external magnetic field such as one created by the earth. This operating procedure is called a "zero method". The problems with prior art flux-gate sensors are outlined in the Primdahl article. Some of these problems are:

In order to obtain high sensitivity, the bandwidth of the bandpass filter (with central frequency 2w), that is to be found at the output of the sensor coil, has to be very narrow in order to leave only the useful signal, suppressing noise and harmonics of the basic operating frequency.

As a consequence of this narrow-band filtering, the component values employed in certain circuitry described in the Primdahl article mentioned above are very critical and thus any drift caused by humidity, aging of components or temperature changes, etc., can make use of the sensor head unfeasible in many possible applications.

THE INVENTION

It is an object of the invention to provide a magnetic field sensor which has very high sensitivity, i.e., which can detect magnetic fields weaker than the field of the earth, should be effectively free of drift problems caused by component aging, stable within a broad range of temperature, humidity changes, and have a wide dynamic range, in short, provide an accurate output under extreme environmental conditions.

The characteristics of all the filtering and phase-shifting operations of the circuits commonly used, of the type described above, are made to depend on a common single reference frequency for the signals being processed, such that their relative variations are always zero.

DRAWINGS

DETAILED DESCRIPTION

Figure 1:
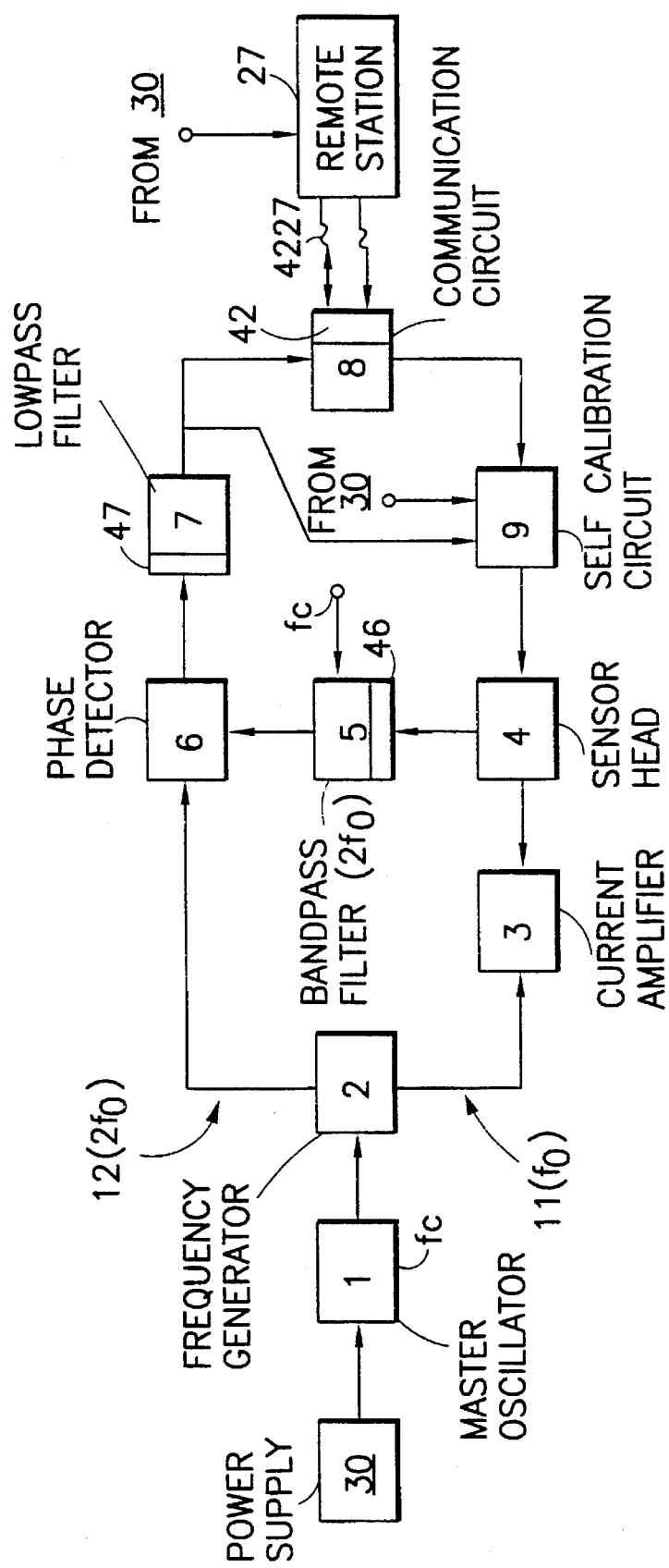
FIG. 1 is a block diagram of the sensor device in accordance with the invention.

The magnetic field sensor device that uses the fluxgate principle, in accordance with the invention, is shown in the block diagram of FIG. 1 in which a master oscillator 1 provides a signal with a stable frequency that is supplied to a frequency generator 2 that generates a first signal 11 and a second signal 12 respectively having frequencies $f_o$ and $2f_o$ from said stable frequency of said master oscillator 1.

In the preferred embodiment, the master oscillator 1 is a crystal oscillator that generates a high frequency >1 MHz, whereas the working frequency $f_o$=5 kHz. To obtain this frequency $f_o$ and the double frequency $2f_o$ a digital frequency divider of any well known and suitable construction is used, and incorporated in generator 2. The signals 12 of frequency $2f_o$ are, preferably, of symmetrical square wave form and are provided to phase detector 6. Phase detector 6 also receives symmetrical square wave inputs from a bandpass filter 5.

The first signal 11 with frequency $f_o$, generated by the frequency generator 2, is amplified in a current amplifier 3 having a current output that is produced in response to an input voltage, which current output is fed to the drive or magnetizing coil 22 (FIG. 2) of the sensor head 4.

The output signal of the current amplifier 3 is distorted in the sensor head 4, and harmonics will result. Only the second harmonic is considered hereinafter. This is the reason why the first bandpass filter 5 has a central frequency $2f_o$.

A signal is produced at the output of sensor coil 23 of the sensor head 4, coupled to a bandpass filter 5, that has a center frequency $2f_o$.

In order to achieve a high sensitivity in this sensor, it is necessary to eliminate the noise that reduces the sensitivity. This is achieved by making the bandpass filter 5 very narrow, e.g., providing narrow filter means 46 therein coupled to receive the sensor head output signal which has a central frequency $2f_o$ as indicated above and that has an amplitude proportional to the sensed magnetic field.

According to a preferred embodiment of the invention, the filter means 46 in filter 5 is a switched-type capacitance filter employing the master oscillator frequency. Such filters are commercial articles, available from electronic parts suppliers, and well known in the art as evidenced by the Philip Allen article mentioned above and the Databook of Texas Instruments and National Semiconductor mentioned hereinabove. Switched-type capacitance filter are used in bandpass filter 5 and in frequency generator 2, that generates the first and second signals 11 and 12 and, are supplied by signals that originate from the same master oscillator 1. In this way, the transfer functions, that is, the central frequency and bandwidth, for the switched-type capacitance filters can be made to depend on a common reference frequency as do the signals 11, 12 generated by the frequency generator 2. A similar situation, although not so critical occurs with the filter 7 which is a lowpass filter. Except for filtering of a difference frequency of phase detector 6, filters 5 and 7 can be similar, or identical.

The present invention is based, in part on the discovery that when the nominal center frequency ($2f_o$) of the bandpass filter 5 and the double frequency ($2f_o$) of the signal 12 are not the same when applied to phase detector 6, the sensor may not work since very little deviation can be tolerated because of the accuracy of the bandwidth filter 5. This difference between the two frequencies ($2f_o$) applied to phase detector 6 can arise as a consequence of leakage, temperature range change, aging, etc. of the electronic components employed in the sensor device.

Figure 2:
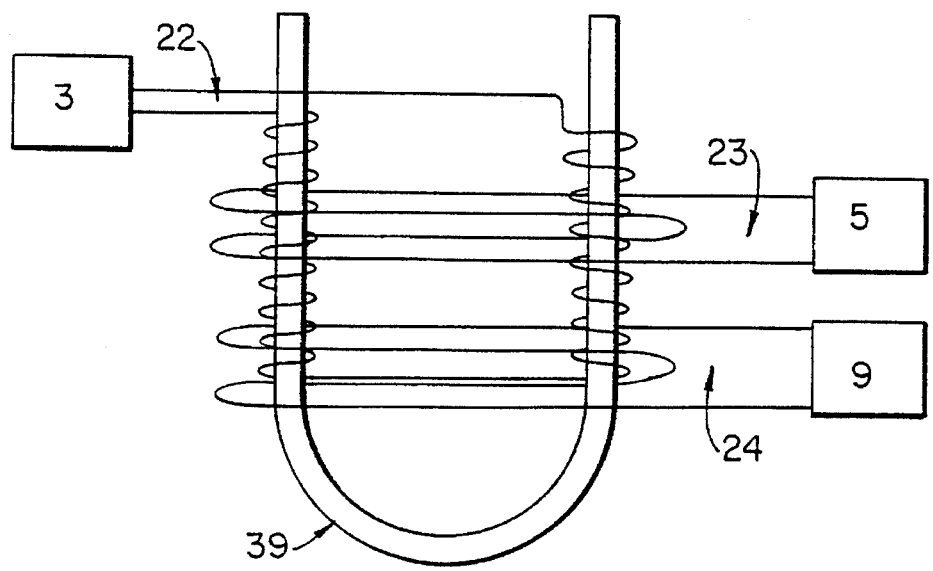
FIG. 2 shows a magnetic field sensor head as it is used in the device of the present invention.

In order to obtain the second harmonic of the frequency, the signal output from the sensor coil 23 of FIG. 2 is filtered by the first bandpass filter 5 that uses the switched-type capacitance filters and employs the frequency of the master oscillator 1 so that, in the event of a variation in a central frequency of the filter 5, the sensor coil 23 output signal always includes a frequency therein that is the same as the frequency controlling the filter 5.

A phase detector 6 (FIG. 1) receives both (1) the second signal 12 with frequency $2f_o$ provided by the frequency generator 2, and (2) the signal output from the first bandpass filter 5 which also has the frequency $2f_o$.

The phase detector 6 for example, may be an analog phase detector which is of the type which uses a diode ring which performs a multiplication of two input signals applied thereto to provide first and second phase detector output signals. The frequency of the first phase detector output signal is the sum of the frequencies of both input signals applied to phase detector 6. The second output signal from phase detector 6 has a frequency which is the difference in the frequencies of both input signals applied to said phase detector 6.

The output of the phase detector 6 has a direct current component, the amplitude of which is proportional to the amplitude of the output from the first bandpass filter 5, and a double frequency component $4f_o$ that is suppressed in a second low pass filter 7.

Figure 6:
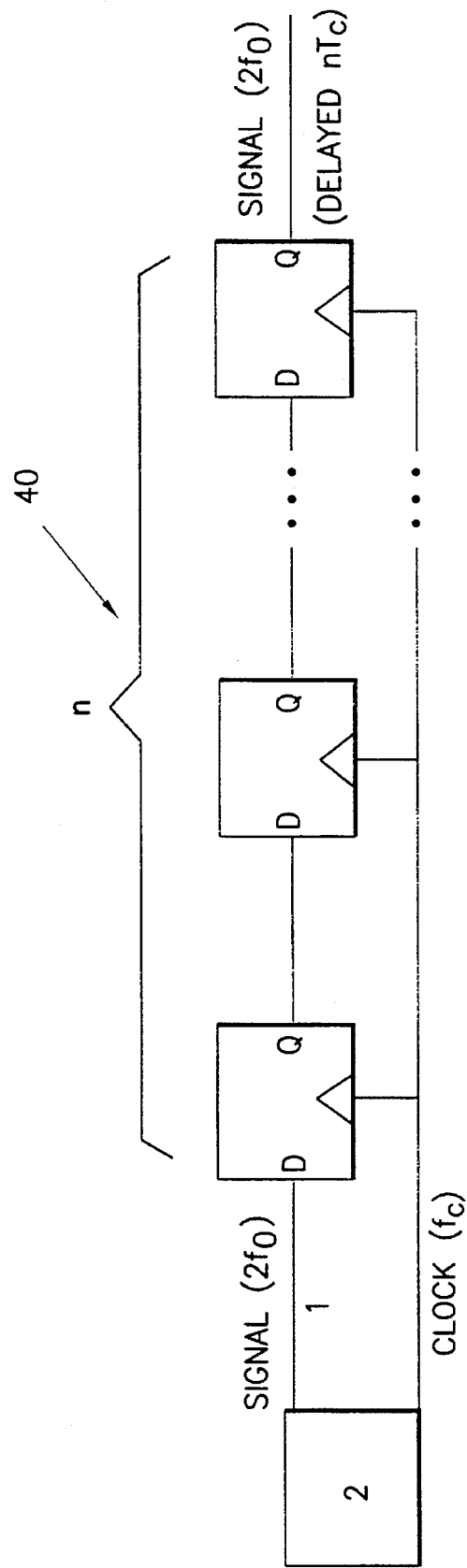
FIG. 6 shows details of a digital delay circuit used in phase shifter 25 shown in FIG. 3.

The phase detector 6 includes a multiplier circuit 26 and a phase shifter 25, that can include a digital delay circuit as shown in FIG. 6. The clock for this delay circuit is also obtained from the master oscillator 1.

Figure 5:
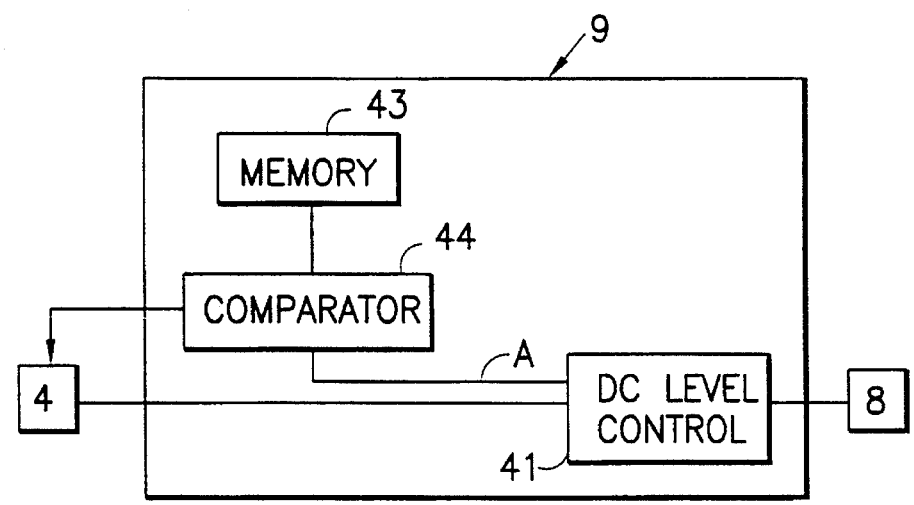
FIG. 5 is a block diagram of the self-calibration circuit 9 shown in FIG. 1.

As shown in FIG. 5, the self-calibration circuit 9 of FIG. 1 has a DC level control means 41 for providing a predetermined DC level signal to the compensating coil 24 of sensor core 39. The DC level control means 41 generates a signal in the sensor coil 23 that is used for checking correct operation of the sensor device. The difference output signal of the phase detector 6 has a direct current component, whose amplitude is proportional to (i) a direct current component of the output signal of the first bandpass filter 5, and (ii) a double frequency component $4f_o$ that is suppressed in a second low filter 7.

Because the frequency of both input signals to phase detector 6 is $2f_o$, the output of phase detector 6 will, as noted above, be (1) a difference frequency between the signals supplied thereto, which in effect, is a direct current and (2) a $4f_o$ frequency signal which is a sum frequency of the signals supplied to phase detector 6. This sum frequency $4f_o$ corresponds to the second harmonic of the frequency $2f_o$, which is filtered out by the lowpass filter 7.

Absent any disturbance signals, the amplitude of the second harmonic of the output signal $2f_o$ derived from the sensor head 4 will be proportional to the magnetic field in the core 39 of the sensor head 4 created by a magnetic field of the earth. This second harmonic $2f_o$ is the output of first bandpass filter 5.

When the phase detector 6 receives the outputs from bandpass filter 5 and the frequency generator 2 which both have the frequency $2f_o$, any relative phases shift between the two signals $2f_o$ provided to the phase detector 6 will remain constant. The amplitude of one of the signals from frequency generator 2 also remains constant; thus, only the amplitude of the signal from the first bandpass filter 5 will vary. Thus, the DC output of the phase detector 6 will be a function of the amplitude variation of the signal received from bandpass filter 5.

Figure 3:
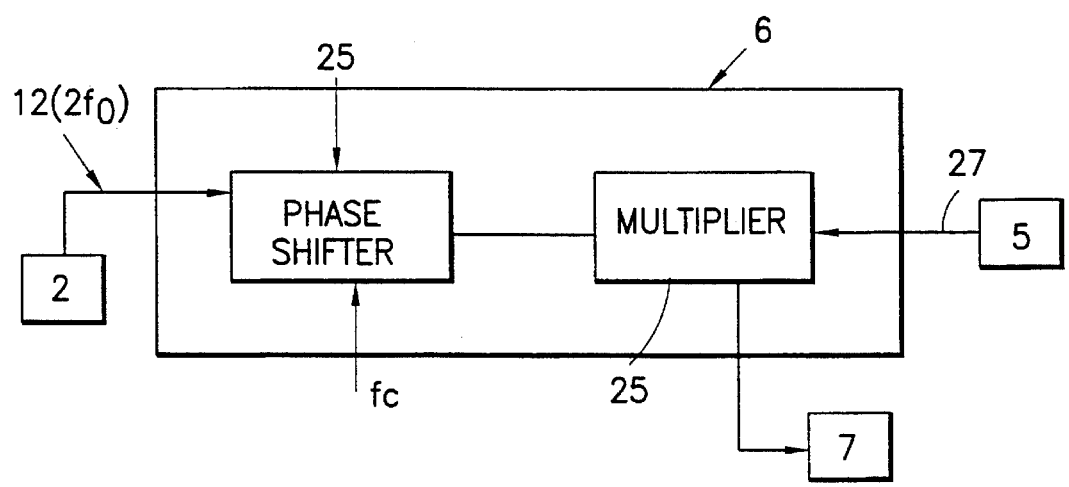
FIG. 3 shows components of the phase detector 6 of FIG. 1.

As shown in FIG. 3, the phase detector 6, comprises a phase shifter 25, that includes a digital delay circuit (see FIG. 6), the clock of which is also obtained from the master oscillator 1; and a multiplier circuit 26. Multiplier 26 multiplies the signal 27 output from filter 5 with the signal 12 which is phase shifted in phase shifter 25 to have a phase coincidence with the signal 27 from filter 5.

In phase detector 6, the coherence between the sum and difference output signals of the phase detector 6 is obvious because both are derived from the same generator 1, so that any phase shifting between the sum and difference output signals of phase detector 6 remains constant during operation of the phase detector 6.

Preferably, the phase detector 6 receives a symmetrical square wave output from the bandpass filter 5.

In the preferred embodiment of the present invention, the phase shifter 25 shown in FIG. 3, which is included in the phase detector 6, is used to shift the input signals supplied thereto. Phase shifting is accomplished as shown in FIG. 6 by forwarding the square wave signal output from filter 5 to the phase detector 6 to a shift register with a clock signal that has the master oscillator 1 frequency. In this way, the square waveform signal is delayed as shown in FIG. 6 by an amount which is dependent on the shift register length and the period of the oscillating signal which corresponds to a small phase shifting step.

The output signal from the second lowpass filter 7 which includes filter means 47 is provided to (i) a communication circuit block 8 that transmits the output from lowpass filter 7 after being suitably adapted to be transmitted on communications channel or link 4227 of FIG. 1, to a remote station 27 and, (ii) to the self-calibration circuit 9. Circuit 9 generates a current that is proportional to the output signal of the second lowpass filter 7. The self-calibration circuit 9 feeds the compensating coil 24 (see FIG. 2) of sensor core 39 thereby closing a loop that cancels a magnetic field generated inside the sensor core 39. This cancelled magnetic field corresponds to a magnetic field generated by the earth.

The self-calibration circuit 9 can be activated remotely by means of a control command signal transmitted thereto via the communications circuit 8 and communication channels or links 4227 from the remote station 27. It is also possible, by means of the control command signals from remote station 27 to control energy supply from a power source 30, and to increase the current flowing in the compensating coil 24 by a defined amount using the variable DC level control means 41 (see FIG. 5) of self-calibration circuit 9 so that an output signal is obtained for checking whether the sensor is operating properly.

The magnetic field self-cancelling feature performed by the self-calibration circuit 9 permits the small magnetic fields created by an electronic portion of the sensor such as, wires, etc. not to affect to the sensor head and hence not affect the overall device. For this reason, it is not necessary to build the device in two separate portions, i.e., an electronics portion and a sensor portion that are joined by cables. Rather, both portions can be physically located closely together.

OPERATION

Responsive to an output from self-calibration circuit 9, the compensating coil 24 wound on core 39 generates a constant magnetic field inside the core 39 which is used to cancel the magnetic field generated by the earth or by other nearby magnetic sources that are present adjacent to the sensor and that interfere with the magnetic field that is actually desired to be detected.

The frequency of the signals 11 and 12 used in the sensor device and the transfer function of the filter means 46, 47 that is, the central frequency fc and bandwidth used in the device depend on the same master oscillator 1.

In the embodiment of the invention, all the signals in the sensor device are derived from the same master oscillator 1 by frequency division, harmonic generation, phase shifting with phase shifters, all using a clock signal derived from the master oscillator 1. Similarly, the filter means 46, 47 are switched-type capacitance filters that use a clock signal derived from the master oscillator 1.

This characteristic permits the magnetic sensor of the invention to work in a broad range of temperature because all the relative inaccuracies among the different circuits of the device disappear, by cancelling each other.

In order to obtain a high sensitivity in the sensor, a bandwidth of the bandpass filter 5 having a central frequency $2w$, that is to be found in the output of the sensor coil 23, has to be very narrow in order to leave only a useful signal; this narrow-band filtering by bandpass filter 5 suppresses noise and harmonics of the basic working operating frequency ($f_o$).

The high sensitivity magnetic field sensor of the invention can operate correctly over a long period of time, even under extreme environmental conditions.

Since the high sensitivity magnetic field sensor of the present invention has components used in circuitry associated with said sensor, which are all dependent on a common single reference frequency for the signals being processed, the relative variations of the characteristics of the various components used in said circuitry is always approximately equal to zero i.e., the sum of the positive and negative shifts in the characteristics of the components due to temperature, humidity and aging, is always approximately equal to zero.

The high sensitivity magnetic field sensor of the invention, as noted hereinabove, includes a self-calibration circuit 9 that receives an output signal from filter 7 via communication circuit 8 representing a detected magnetic field and that is connected to feed the compensating coil 24 of the sensor head with a compensating signal that cancels the earth's magnetic field that exists inside the core of the sensor and thereby enables much weaker magnetic fields, that is, fields that are weaker than the earths magnetic field, to be detected.

Figure 4:
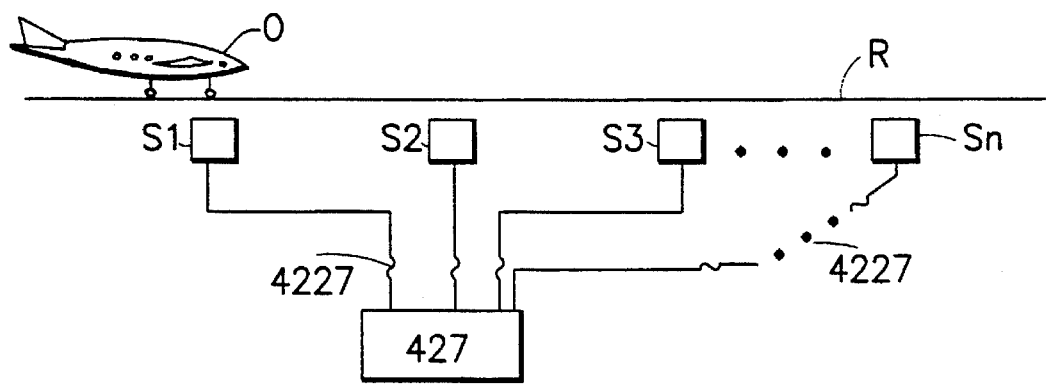
FIG. 4 is a schematic diagram of a sensor system used in detection of aircrafts on runways.

As shown in FIGS. 1 and 4, the communication circuit 8 in the sensor, as noted hereinabove, transmits a output signal from filter 7 to a remote station 27T 427 via channels or links 4227, and receives a feeding current command and control commands via channels or links 4227 from said remote station 27, 427.

Commands from remote station 27, 427, received by receiving means 42 in communication circuit 8 enable control of the powering of the sensor device from power source 30.

A stored complete set of operating characteristics of this sensor device is stored in a memory 43 of FIG. 5 of self calibration circuit 9. This enables the sensor device to be self-checked for proper functioning over a very wide temperature range, as well as to enable a purely electronic portions thereof to be positioned close to the sensor head 4. This self-calibration function, compares stored curves in memory 43 with the output A of DC level control 41. The output of comparator 44 is used to control the input provided to the compensating coil 24 of sensor head 4. This self-calibration additionally permits the sensor to be miniaturized. As a result, the sensor can be used in locations where temperatures are extreme and where maintenance, is difficult such as is ground aircraft traffic control system at airports.

In the present invention, control commands are provided to the high sensitivity magnetic field sensor which permit a self-calibration of the sensor to occur as well as to enable the sensor to test itself. This self-calibration is provided by the self-calibration circuit 9 and is accomplished by changing the compensating coil current by a certain amount to obtain an output signal with a value that depends on this certain amount change in current and thus serves to check whether the sensor is operating properly using the stored characteristic curves stored in memory 43. Signals are received by self-calibration circuit 9 on channels 4227 from the remote station 27, 427 via communication circuit 8 and are compared in comparator 44 with the stored curves stored in memory 43. The comparator 44 provides an output signal which is provided to the compensating coil 24 of the sensor head 4.

The flux-gate magnetometer device is particularly suitable to sense the presence of disturbances of the magnetic field due to objects within its sensitivity range. A typical application would by the sensing of the presence of aircraft on runways of airports as shown in FIG. 4. The device permits balancing out the effects of the earth's magnetic field, as well as other disturbances and variations caused by circuit changes, for example, due to aging, temperature or humidity and the like.

As shown in FIG. 4, a ground aircraft control system includes a plurality of sensing devices S1, S2, S3 . . . $S_n$ which are distributed along a runway R to sense the presence of objects O, shown as an aircraft. The sensing devices which include the entirety of the circuit shown in FIG. 1 up to the communication link or channels 4227 are connected by suitable communication means to a common remote station 427. The remote station 427 can, selectively, control the self-checking of the respective sensor devices S1, S2, S3 . . . $S_n$ in the ground control system as well as the control of energy thereto, for example, by controlling the state of a power supply 30 (FIG. 1) coupled, individually or in common to the respective sensor apparatus S1, S2, S3 . . . $S_n$ in the ground control system.

Various changes and modifications may be made, and features described in connection with any one of the embodiments may be used with any of the others, within the scope of the inventive concept.

We claim:

1. A magnetic sensor device which utilizes a flux-gate principle; and wherein:

a second harmonic of a sensor coil (23) output signal of a sensor head (4) is canceled to thereby cancel a magnetic field generated by an external source external to said magnetic sensor device, said magnetic sensor device comprising:

the sensor head (4) including:
a core (39) having a magnetizing coil (24), a sensor coil (23) and a drive coil (22) wound thereon;
current generating means (1, 2) for generating a stabilized clock, or central frequency (fc), and a stabilized amplified first current having a frequency ($f_o$) which is a fraction of and derived from said clock or central frequency, said first stabilized current $f_o$ being connected to drive said drive coil (22) mounted on said core (39) of said sensor head (4) for driving said core into a saturated state thereof;
a bandpass filter (5) connected to receive an output signal of said sensor coil (23) of said sensor head (4), said bandpass filter (5) including a first filter means (46) for filtering a center frequency ($2f_o$) of said output signal of said sensor coil (23) and for providing a bandpass filtered output signal ($2f_o$);
said center frequency ($2f_o$) being a second harmonic of said output signal of said sensor coil (23);

a phase detector (6) for receiving:
(i) a second stabilized current (12) having twice the frequency ($2f_o$) as said stabilized first current, said second stabilized current being derived from said current generating means (1, 2); and
(ii) a filtered output signal from said bandpass filter (5);
said phase detector (6) generating a phase detector output signal based on both the second stabilized current ($2f_o$) and said bandpass filtered output signal ($2f_o$) from said bandpass filter (5);

a lowpass filter (7) connected to receive said phase detector output signal from said phase detector (6), said lowpass filter including second filter means (47) and providing a lowpass filter output signal which is proportional to a magnetic field that is generated in said core (39) of said sensor head (4) by an external magnetic source; and wherein:

a transfer function of said first and second filter means (46, 47) in said bandpass and lowpass filters (5, 7) respectively being dependent on the central (fc) frequency, said central frequency being common to the first ($f_o$) and second ($2f_o$) stabilized currents (11, 12) generated by said current generating means (1), whereby
the output signal of said sensor coil and said phase detector input signal respectively being input to said bandpass and lowpass filters, as well as said central frequency (fc) being all derived from a common frequency of the current generating means.

2. The device according to claim 1, wherein:
said drive coil (22) and a compensating coil (24) of said sensor head (4) are respectively fed a magnetizing and a compensating signal in a current mode such that possible variations in a self-inductance of said core (39) in said sensor head (4) will not cause a phase change in one of said magnetizing and compensating signals when compensating and magnetizing signals are provided to said phase detector (6).

3. The device according to claim 1, wherein:
said first and second filters means (46, 47) each comprise switched-type capacitance filters in which a clock frequency thereof is obtained from said current generating means (1) that produces said first stabilized current having the frequency ($f_o$) and said second stabilized current having the frequency ($2f_o$).

4. The device according to claim 3, wherein:
said phase detector (6) comprises:
multiplier means (26) for multiplying (i) the output signal (27) of the first bandpass filter (5), said bandpass filter (5) having said center frequency $2f_o$ and (ii) said second stabilized current (12) having a frequency ($2f_o$) output from the current generating means (1, 2);
a phase shifter (25) connected to said multiplier means; and
wherein said current generating means (1, 2) generates said second stabilized current (12) having said frequency ($2f_o$) to have a symmetric square waveform which is shifted in phase by said phase shifter (25) such that the symmetric square waveform coincides in phase with said bandpass filtered output signal ($2f_o$) from said bandpass filter (5).

5. The device according to claim 4, wherein:
said phase shifter comprises:
a digital delay circuit (40) coupled to said current generating means (1, 2) for delaying a signal input thereto by a whole number of clock periods.

6. The device according to claim 2, further comprising:
a self-calibration circuit (9) connected to receive an output signal from said lowpass filter (7), said self-calibration circuit (9) further including means for supplying the compensating coil (24) of the sensor head (4) with a signal that is proportional to and opposite in phase to the output signal received from said lowpass filter (7) for cancelling a magnetic field created in said core (39) of said sensor head (4) by said external magnetic source; and
a communication circuit (8) connected to receive the output of the lowpass filter (7) for transmitting the output signal of the lowpass filter (7) via communication means (4227) to a remote station (27, 427).

7. The device according to claim 6, wherein the communication circuit (8) also includes receiving means (42) for receiving signals from the remote station (27) via communication means (4227), said signals from said remote station including command signals for commanding the self-calibration circuit (9) to control a DC level control circuit (41) to supply a predetermined direct current to the compensating coil (24) to thereby cancel the magnetic field created by the external magnetic source that are present in the core (39) of the sensor head;
said compensating coil (24) generating a compensated output signal in the sensor coil (23), a level of the compensated output signal of the sensor coil (23) permitting checking for a correct operation of the sensor device.

8. The device according to claim 6, wherein the communication circuit (8) also receives power supply command signals from the remote station (27, 427) for commanding a supply of power to the sensor device from a power source (30).

9. The device according to claim 6, wherein each sensor device has an electronic portion (1, 2, 3, 5, 6, 7, 8, 9 (FIG. 1) that is physically located adjacent to the sensor head (4) a magnetic field self-cancelling characteristic of the sensor head permitting miniaturization of the sensor device.

10. The device according to claim 1, for use in combination with an aircraft ground traffic control system that is positioned along an aircraft runway, further comprising:
a plurality of said sensor devices installed and distributed along the runway; and wherein
said plurality of sensor devices are controlled by a remotely positioned central control station (427).

11. The device according to claim 10, wherein each sensor device S1, S2 . . . $S_n$ is included in the aircraft ground traffic control system, and each sensor senses a presence of an aircraft adjacent thereto.

12. The device according to claim 2, wherein:
the current generating means (1, 2) comprises a frequency generator (2) which generates first (11) and second (12) signals with frequencies $f_o$ and $2f_o$ respectively; and
said current generating means (1, 2) further includes:
a master oscillator (1) for generating the stabilized clock or central frequency (fc); and
a current amplifier (3) for amplifying the first signal (11) having a frequency ($f_o$) before said first frequency (11) having a frequency ($f_o$) is supplied to the magnetizing coil (24) of the sensor head (4).

13. The device according to claim 1, wherein the lowpass filter (7) comprises a lowpass filter and said second filter means (47).

14. The device according to claim 2, wherein the lowpass filter comprises a lowpass filter and said second filter means (47).

15. The device according to claim 1, wherein the first and second filter means (46, 47) respectively comprise switched-type capacitance filters.

16. The device according to claim 2, wherein the first and second filter means (46, 47) respectively comprise switched-type capacitance filters.

17. A magnetic sensor device which utilizes a flux-gate principle; and wherein a second harmonic of a sensor coil (23) output signal of a sensor head (4) is canceled to thereby cancel a magnetic field generated by an external source that is external to said magnetic sensor device,
said magnetic sensor device comprising:
a sensor head (4) including a core (39) having a compensating coil (24), a sensor coil (23) and a drive coil (22) wound thereon;
current generating means (1, 2) for generating a stabilized amplified stable clock frequency (fc) first current having a frequency ($f_o$) which is a fraction of said clock frequency, said first current ($f_o$) being connected to drive said drive coil (22) mounted on said core (39) of said sensor head (4) for driving said core into a saturated state thereof;
a bandpass filter (5) connected to receive an output signal of said sensor coil (23), said bandpass filter (5) including first filter means for filtering a center frequency ($2f_o$) of said output signal of said sensor coil (23);
said center frequency ($2f_o$) being a second harmonic of said output signal of said sensor coil (23), and said bandpass filter providing a bandpass filtered output signal ($2f_o$);
a phase detector (6) for receiving:
(i) a second stabilized current having twice the frequency ($2f_o$) as said first frequency, said second stabilized current being derived from said current generating means (1, 2); and
(ii) said bandpass filtered output signal from said bandpass filter (5);
said phase detector (6) generating a phase detector output signal based on both the second stabilized current ($2f_o$) and said bandpass filtered output signal ($2f_o$) from said bandpass filter (5);
a lowpass filter (7) connected to receive said phase detector output signal from said phase detector (6), said lowpass filter including second filter means (47) for providing a lowpass filtered output signal which is proportional to a magnetic field that is generated in said core (39) of said sensor head (4) by an external magnetic source; and wherein:
a transfer function of said first and second filter means (46, 47) in said bandpass and lowpass filters (5, 7) is dependent on a central frequency (fc) that is common to the first ($f_o$) and second ($2f_o$) stabilized currents (11, 12) generated by said current generating means (1, 2);
said drive coil (22) and said compensating coil (24) of said sensor head (4) are respectively fed a magnetizing and a compensating signal in a current mode such that variations in a self-inductance of said core (39) in said sensor head (4) created by the external magnetic field will not cause a phase change in one of said magnetizing and compensating signals prior to said compensating and magnetizing signals being provided to said phase detector (6);
a self-calibration circuit (9) connected to receive an output signal from said lowpass filter (7), said self-calibration circuit (9) including means for supplying the compensating coil (24) of the sensor head (4) with a signal that is proportional to and opposite in phase to the output signal received from said lowpass filter (7) for canceling a magnetic field created in said core (39) of said sensor head by said external magnetic source; and a communication circuit (8) connected to receive the output of the lowpass filter (7) for transmitting the output signal of the lowpass filter (7) to a remote station (27, 427).

18. The device according to claim 17, wherein:

said first and second filters means (46, 47) are switched-type capacitance filters in which a working frequency thereof is also obtained from said current generating means (1, 2) that produces said first current having the frequency ($f_o$) and said second current having the frequency ($2f_o$).

19. The device according to claim 18, wherein:

said phase detector (6) comprises:

multiplier means (26) for multiplying (i) the bandpass filtered output signal of the bandpass filter (5), said bandpass filter (5) having said center frequency $2f_o$ and (ii) said lowpass filtered output signal output by said lowpass filter (7) that has a frequency ($2f_o$) output from the current generating means (1, 2);

a phase shifter (25) connected to said multiplier; and wherein said current generating means (1, 2) generates said second current having a frequency ($2f_o$) to have a symmetric square waveform which is shifted in phase by said phase shifter (25) such that the symmetric square waveform coincides in phase with said filtered output signal from said bandpass filter (5).

20. A magnetic sensor device which utilizes a flux-gate principle; and wherein:

a second harmonic of a sensor coil (23) output signal of a sensor head (4) is canceled to thereby cancel a magnetic field generated by an external source external to said magnetic sensor device, said magnetic sensor device comprising:

the sensor head (4) including:

a core (39) having a magnetizing coil (24), a sensor coil (23) and a drive coil (22) wound thereon;

current generating means (1, 2) for generating a stabilized clock, or central frequency (fc), and an amplified first current having a frequency ($f_o$) which is a fraction of and derived from said clock or central frequency, said first current $f_o$ being connected to drive said drive coil (22) mounted on said core (39) of said sensor head (4) for driving said core into a saturated state thereof;

a bandpass filter (5) connected to receive an output signal of said sensor coil (23) of said sensor head (4), said bandpass filter (5) including a first filter means (46) for filtering a center frequency ($2f_o$) of said output signal of said sensor coil (23) and for providing a first bandpass filtered output signal ($2f_o$);

said center frequency ($2f_o$) being a second harmonic of said output signal of said sensor coil (23);

a phase detector (6) for receiving:

(i) a second stabilized current (12) having twice the frequency ($2f_o$) as said first frequency, said second stabilized current being derived from said current generating means (1, 2); and (ii) a filtered output signal from said bandpass filter (5);

said phase detector (6) generating a phase detector output signal based on both the second stabilized current ($2f_o$) and said bandpass filtered output signal ($2f_o$) from said bandpass filter (5);

a lowpass filter (7) connected to receive said phase detector output signal from said phase detector (6), said lowpass filter including second filter means (47) and providing an output signal which is proportional to a magnetic field that is generated in said core (39) of said sensor head (4) by an external magnetic source; and wherein:

a transfer function of said first and second filter means (46, 47) in said bandpass and lowpass filters (5, 7) being dependent on the central (fc) frequency, said central frequency being common to the first ($f_o$) and second ($2f_o$) stabilized currents (11, 12) generated by said current generating means (1); and wherein said drive coil (22) and a compensating coil (24) of said sensor head (4) are respectively fed a magnetizing and a compensating signal in a current mode such that possible variations in a self-inductance of said core (39) in said sensor head (4) will not cause a phase change in one of said magnetizing and compensating signals when compensating and magnetizing signals are provided to said phase detector (6); and further comprising:

a self-calibration circuit (9) connected to receive an output signal from said lowpass filter (7), said self-calibration circuit (9) further including means for supplying the compensating coil (24) of the sensor head (4) with a signal that is proportional to and opposite in phase to the output signal received from said lowpass filter (7) for canceling a magnetic field created in said core (39) of said sensor head (4) by said external magnetic source; and a communication circuit (8) connected to receive the output of the lowpass filter (7) for transmitting the output signal of the lowpass filter (7) via communication means (4227) to a remote station (27, 427).

21. The device according to claim 20, wherein the communication circuit (8) also includes receiving means (42) for receiving signals from the remote station (27) via communication means (4227), said signals from said remote station including command signals for commanding the self-calibration circuit (9) to control a DC level control circuit (41) to supply a predetermined direct current to the compensating coil (24) to thereby cancel the magnetic field created by the external magnetic source that are present in the core (39) of the sensor head;

said compensating coil (24) generating a compensated output signal in the sensor coil (23), a level of the compensated output signal of the sensor coil (23) permitting checking for a correct operation of the sensor device.

22. The device according to claim 20, wherein the communication circuit (8) also receives power supply command signals from the remote station (27,427) for commanding a supply of power to the sensor device from a power source (30).

23. The device according to claim 20, wherein each sensor device has an electronic portion (1, 2, 3, 5, 6, 7, 8, 9 that is physically located adjacent to the sensor head (4) a magnetic field self-canceling characteristic of the sensor head permitting miniaturization of the sensor device.

* * * * *

UNITED STATES PATENT AND TRADEMARK OFFICE
CERTIFICATE OF CORRECTION

PATENT NO. : 5,530,349
DATED : June 25, 1996
INVENTOR(S) : Braulio TAMAYO LOPEZ et al.

It is certified that error appears in the above-indentified patent and that said Letters Patent is hereby corrected as shown below:

In the Title Page,

Under Section [54] INVENTORS, change "Braulio T. Lopez" to --Braulio Tamayo Lopez--, change "Miguel H. Carbonero" to --Miguel Hernandez Carbonero--, change "Francisco S. Hernandez" to --Francisco Sempere Hernandez--, change "Claudio A. Hernandez-Ros" to --Claudio Aroca Hernandez-Ros--, change "Carmen S. Trujillo" to --Carmen Sanchez Trujillo--, change "Eloisa L. Perez" to --Eloisa Lopez Perez--, change "Pedro S. Sanchez" to --Pedro Sanchez Sanchez---.

UNITED STATES PATENT AND TRADEMARK OFFICE
CERTIFICATE OF CORRECTION

PATENT NO. : 5,530,349
DATED : June 25, 1996
INVENTOR(S) : Braulio TAMAYO LOPEZ et al.

It is certified that error appears in the above-indentified patent and that said Letters Patent is hereby corrected as shown below:

Add the following references to the end of the listing of "OTHER PUBLICATIONS"

--"Switch capacitor circuits" by Philip E. Allen & Edgar Sanchez-Sinenchio, Van Nostrand Reinhold Company, Inc., 135 West 50th Street, NY 10020 USA;

Databook Volume 2, Texas Instruments, "Linear Circuits", Data Acquisition and Conversion, pages 2-139 to 2-153, dev.: TLC10/MF10A, TLC20/MF10C, Universal Dual Switched-Capacitor Filter.--

Under Section [57] ABSTRACT, line 16, change "low" to --lowpass--.

Column 8, claim 4, line 4, delete "first".

Signed and Sealed this

Twenty-fourth Day of June, 1997

*Attest:*

*Attesting Officer*

BRUCE LEHMAN

*Commissioner of Patents and Trademarks*